United States Patent
Eto et al.

[11] Patent Number: 6,141,274
[45] Date of Patent: Oct. 31, 2000

[54] SEMICONDUCTOR INTEGRATED CIRCUIT HAVING A PRE-CHARGED OPERATION AND A DATA LATCH FUNCTION

[75] Inventors: Satoshi Eto; Masato Matsumiya; Yuichi Uzawa; Kuninori Kawabata; Akira Kikutake; Toru Koga, all of Kawasaki, Japan

[73] Assignee: Fujitsu Limited, Kanagawa, Japan

[21] Appl. No.: 09/340,145

[22] Filed: Jun. 28, 1999

[30] Foreign Application Priority Data

Jun. 30, 1998 [JP] Japan .................................. 10-184808
Jul. 2, 1998 [JP] Japan .................................. 10-187877

[51] Int. Cl.$^7$ ...................................................... G11C 7/00
[52] U.S. Cl. ...................................... 365/203; 365/189.05
[58] Field of Search .................................... 365/203, 233, 365/189.05, 191

[56] References Cited

U.S. PATENT DOCUMENTS

| | | | |
|---|---|---|---|
| 5,748,553 | 5/1998 | Kitamura | 365/230.03 |
| 5,805,504 | 9/1998 | Fujita | 365/189.05 |
| 5,828,608 | 10/1998 | Nguyen et al. | 365/189.05 |

*Primary Examiner*—Son Mai
*Attorney, Agent, or Firm*—Arent Fox Kintner Plotkin & Kahn PLLC

[57] ABSTRACT

In a semiconductor integrated circuit having the function of executing a pre-charge operation of a data bus when data is transferred to the data bus from a plurality of driver circuits connected to the data bus, a reset circuit for executing the pre-charge operation of the data bus is constituted so as to start the pre-charge operation of the data bus upon receiving an end timing of a strobe signal. Preferably, the reset circuit detects that the data bus reaches a pre-charge level for executing the pre-charge operation, and then terminates the pre-charge operation. On the other hand, in a semiconductor integrated circuit having a data latch function by a pipeline system when the data is read out from a memory cell, etc., in synchronism with a clock, a plurality of latch circuit units for temporarily storing the data are disposed in a data read path, and each of these latch circuit units is constituted in such a manner as to allow the data to pass, as such, when a control signal for controlling data latch is inputted, and to latch the data when the control signal is not inputted.

11 Claims, 13 Drawing Sheets

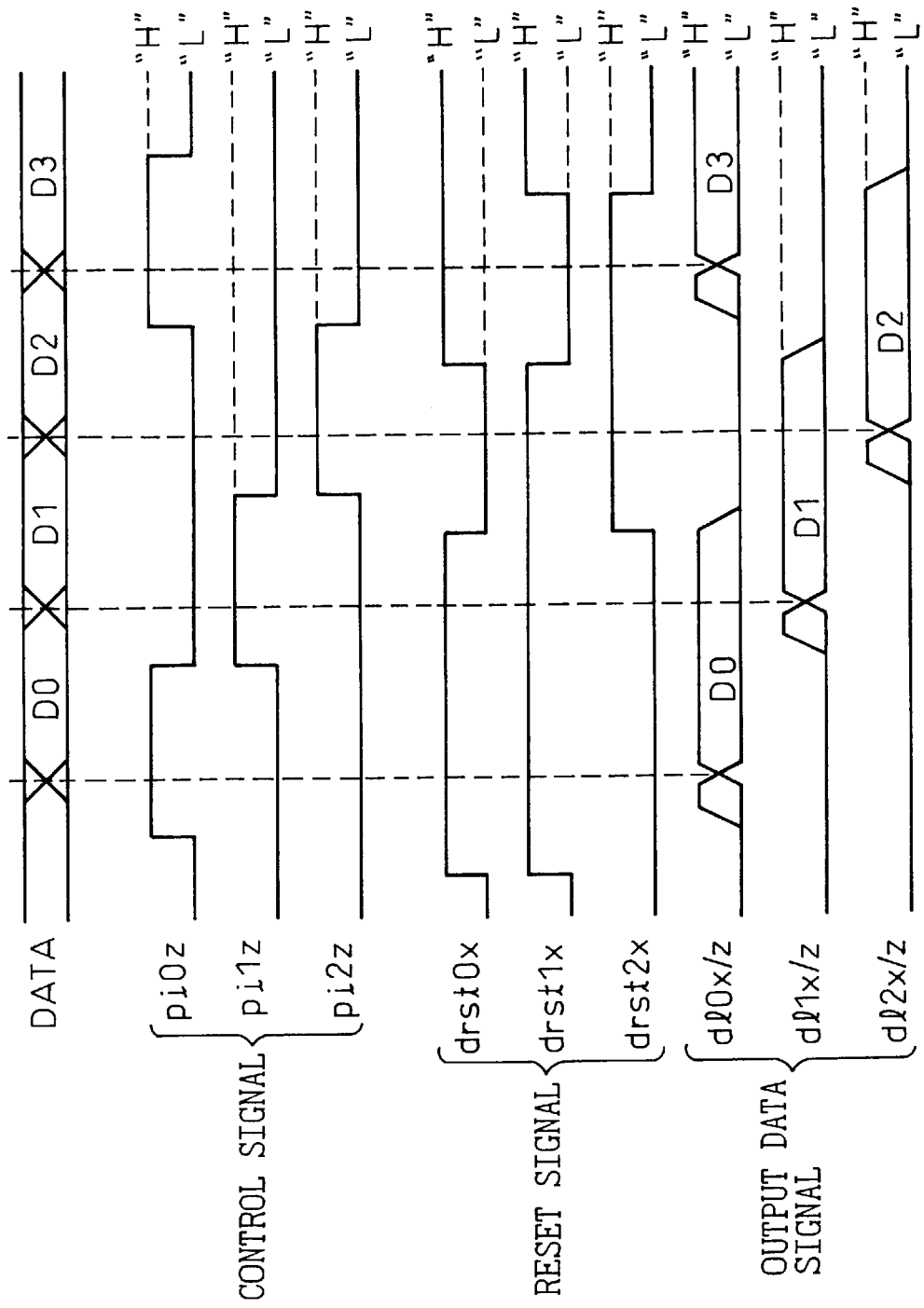

SEMICONDUCTOR INTEGRATED CIRCUIT HAVING A PRE-CHARGED OPERATION AND A DATA LATCH FUNCTION

BACKGROUND OF THE INVENTION

1. Field of the Invention

The present invention relates to a semiconductor integrated circuit having the function of executing a pre-charge operation of a single phase data bus when data is transferred to this data bus from a plurality of driver circuits, such as data bus amplifiers, connected to the single phase data bus. Semiconductor integrated circuits of recent types such as a synchronous dynamic random access memory (hereinafter abbreviated to "SDRAM") are required to operate in synchronism with a high-speed clock of 100 MHz or more than 100 MHz, for example. To satisfy the requirement for such high-speed operation, data transfer on a data bus must be carried out efficiently. In other words, it is necessary to reset the data bus after sampling one data, so that serial data that is transferred on the data bus can be sequentially sampled. This operation is referred to as a "pre-charge operation" of the data bus.

The present invention also relates to a semiconductor integrated circuit having a data latch function for temporarily storing the data by a pipeline control system when the data is read out from a memory cell, etc., in synchronism with a clock. Recently, the semiconductor integrated circuits such as the SDRAM are required to operate in synchronism with a high-frequency clock of 100 MHz or more than 100 MHz, as described above. To satisfy this requirement, the data in the memory cells of the semiconductor integrated circuit must be read out correctly in synchronism with the high-frequency clock. Speaking in further detail, it is necessary to arrange a plurality of latch circuits in parallel in a data read path and to execute pipeline control of the data read out from the memory cells by temporarily storing the data for each bit by these latch circuits.

2. Description of the Related Art

When the data in the memory cells of a semiconductor integrated circuit such as the SDRAM is read out, it is necessary to accurately recognize the timing at which the data is transferred to the data bus after the pre-charge operation of the data bus is completed, so as to correctly sample the data of a serial system which is transferred from an arbitrary amplifier among a plurality of data bus amplifiers for reading the data in the memory cells to the single phase data bus. Generally, the data of the data bus is sampled by a pulse of a strobe signal representing the effective period of the data on the single-phase data bus.

In order to more easily understand the problem of the semiconductor integrated circuits having the pre-charge function according to the prior art, an example of the prior art technology for sampling the data by the pulse of the strobe signal on the single-phase data bus for executing the pre-charge operation will be explained with reference to FIGS. 1 to 3 of the later-appearing "BRIEF DESCRIPTION OF THE DRAWINGS".

FIG. 1 is a block diagram showing a schematic construction of a semiconductor integrated circuit having a pre-charge function according to the prior art; FIG. 2 is a circuit diagram showing a concrete construction of a reset circuit shown in FIG. 1; and FIG. 3 is a timing chart useful for explaining the operation of FIG. 2. However, the construction of the semiconductor device and its operation will be hereby explained in the case in which the data transferred from a data bus amplifier, etc., to the data bus is sampled when the data in the memory cells of a semiconductor integrated circuit such as an SDRAM is read out.

The semiconductor integrated circuit shown in FIG. 1 includes a row decoder 210 and a column decoder 220 for selecting a specific memory cell from among a plurality of memory cells disposed in matrix, and for writing and reading data. The data read out from the specific memory cells selected by these row decoder 210 and column decoder 220 is delivered to a data bus amplifier 240 through a sense amplifier 230. The data bus amplifier 240 comprises a plurality of amplification circuits (that is, a plurality of driver circuits), and these driver circuits are connected to four data buses DB-1, DB-2, DB-3 and DB-4 for transferring the data.

Referring further to FIG. 1, the data transferred to the data buses DB-1 to DB-4 from the memory cell amplifier 240 is outputted outside the semiconductor integrated circuit through a data output buffer 250 (as output data DQ). One strobe signal line SL is disposed for four data buses DB-1 to DB-4 on the strobe signal line SL so as to output a strobe signal STR (refer to FIGS. 2 and 3) representing the effective period of the data. The semiconductor integrated circuit includes further a reset circuit 100 for executing the pre-charge operation of the data on the data buses DB-1 to DB-4 on the basis of the start timing of the strobe signal STR.

FIG. 2 shows a concrete circuit construction of this reset circuit 100. The reset circuit shown in FIG. 2 includes a NOR gate 100a to which the strobe signal STR and a specific input signal Sin are inputted, and an inverter 101 on the output side of the NOR gate 100a. Since the input signal Sin is generally set to a low voltage level ("L (Low)" level), a signal generated by inverting the voltage level of the strobe signal STR is outputted from the NOR gate 100a. The signal outputted from the NOR gate 100a is inverted by the inverter 101 and is inputted to one of the input terminals of the NAND gate 102. On the other hand, the data on the data buses DB-1 to DB-4 (output data DQ) is inputted to the other input terminal of the NAND gate 102 through the NAND gate 114.

The reset circuit shown in FIG. 2 includes a latch circuit comprising two NAND gates 103 and 104 on the output side of the NAND gate 102. Inverters 105 to 109 of a plurality of stages (for example, 5 stages) are disposed on the output side of the latch circuit. These inverters 105 to 109 of a plurality of stages have the function of adjusting the later-appearing latency time. The reset signal RST outputted from the last stage inverter 109 is inputted to the gates of a plurality of P-channel transistors 110 to 113. The sources of these P-channel transistors 110 to 113 are connected to a power source (internal power source) Vii having a positive polarity, and their drains are connected to the data buses DB-1 to DB-4, respectively. The reset signal RST described above is sent from the drains of the P-channel transistors 110 to 113 to the corresponding data buses DB-1 to DB-4.

FIG. 3 shows the operation of the reset circuit described above. While the semiconductor integrated circuit is in the read mode, data DATA of a negative pulse is transferred to a data bus of a single phase on the basis of enable signals EN1 to ENn (not shown in the drawing; see later-appearing FIG. 7) representing that the data is read out from the memory cell. A strobe signal STR of a positive pulse representing the effective period of the data DATA is transferred to a strobe signal line on the basis of the enable signal EN.

To sample the data DATA on the data bus by this strobe signal STR, a reset signal RST of a positive pulse is generated with a time margin corresponding to the pulse width of the strobe signal STR from the start timing of the pulse of the strobe signal STR (the rise edge when the pulse is the positive pulse, or the fall edge when the pulse is the negative pulse, as shown in FIG. 3). In this case, however, "Bus-Fight" (i.e., bus contention) on the data bus will occur if the pre-charge operation by the reset signal RST is executed and the data DATA rises to the high voltage level ("H" (High)" level) before the pulse of the strobe signal STR terminates and falls down.

To avoid the "Bus-Fight" on the data bus, it is necessary to secure a time margin of a certain extent between the end timing of the pulse of the strobe signal STR and the start timing of the pulse of the reset signal RST. Speaking more concretely, it is necessary to generate the reset signal RST by producing a predetermined delay time (the time corresponding to the margin) from the end timing of the strobe signal STR by a plurality of inverters 105 to 109 of a plurality stages in the reset circuit shown in FIG. 2. Therefore, the latency time corresponding to the time interval between the start of the pulse of the strobe signal STR and the start of the pulse of the reset signal RST is set to a time longer than the pulse width of the practical strobe signal. Therefore, the latency time of the data bus, that is, the data occupied time on the data bus, becomes elongated, and the operating frequency cannot be increased easily.

On the other hand, a wave pipeline control system has been employed as a typical example of the pipeline control of the data read out from the memory cells of semiconductor integrated circuits such as the SDRAM. A plurality of latch circuits referred to as "FIFO" (First-In First-Out) are disposed generally in parallel in the data read path in such a wave pipeline control system, and the control of the latency time at the time of data read-out is controlled at the portion of these latch circuits. It has been customary to execute the wave pipeline control of the data by operating a plurality of latch circuits of the FIFO after the data read out from the memory cell is determined.

An example of the conventional semiconductor integrated circuits having the data latch function by such a wave pipeline control system will be explained hereby with reference to FIGS. 4 to 6 as in "BRIEF DESCRIPTION OF THE DRAWINGS" that appears later so that the problems of the prior art system may be more readily understood.

FIG. 4 is a block diagram showing the construction of a semiconductor integrated circuit of the prior art equipped with the data latch function; FIG. 5 is a circuit diagram showing the construction of the latch circuit of the semiconductor integrated circuit of the prior art; and FIG. 6 is a timing chart useful for explaining the operation of the semiconductor integrated circuit shown in FIG. 4. In this case, the operation and construction of a semiconductor integrated circuit for executing the wave pipeline control by using the FIFO comprising three latch circuits disposed in parallel in the data read path will be explained typically.

In the semiconductor integrated circuit shown in FIG. 4, first to third latch circuits 190-1 to 190-3 for temporarily storing the data DATA of the complementary system, that are read out from a plurality of memory cells (not shown, in particular) disposed in matrix, are provided in parallel with the read path of the data DATA of the complementary system. These three latch circuits 190-1 to 190-3 have the function of latching the data DATA in the sequence of bits in synchronism with the clock and also the function of sending the data DATA in the order of latching to a data out buffer 8 by a selector 7. The latch circuits 190-1 to 190-3 and the selector 7 are generically referred to as the "FIFO".

The explanation will be given in further detail. The three latch circuits 190-1 to 190-3 serially latch, for each bit, the input data signals irdx, irdz (which generically represent the input data signals ird0x, ird0z, ird1x, ird2x and ird2z that are latched by the first to third latch circuits), that represent the data DATA of the complementary system, on the basis of the corresponding control signals pi0z, pi1z and pi2z for controlling data latch, respectively. In order to reliably latch the input data signal that is inputted next, the input data signals are reset by the corresponding reset signals drst0x, drst1x and drst2x in the inputting order to the data output buffer 8.

In FIG. 4, further, the data of the complementary system (d1x and d1z) that pass through the latch circuits 190-1 to 190-3 are sent as the output data signals d10x, d10z, d11x, d11z, d12x and d12z to the selector 7. Six output data signals d10x, d10z, d11x, d11z, d12x and d12z selected serially by this selector 7 are outputted outside the semiconductor integrated circuit through the data output buffer 8 (output data DQ). In other words, in the semiconductor integrated circuit shown in FIG. 4, the data read out from the memory cells are inputted to the first to third latch circuits 190-1 to 190-3, and are then outputted from the data output buffer 8 after the passage of a certain latency time.

FIG. 5 shows a concrete construction of each of these latch circuits 190-1 to 190-3. In the latch circuit shown in FIG. 5 (for example, the first latch circuit 190-1), a first data latch unit comprising two inverters 150 and 155 for latching one ird0x of the complementary system is disposed. On the other hand, a second data latch unit comprising two inverters 160 and 165 for latching the other input data signal ird0z is disposed, too. These first and second data latch units have the function of storing the high voltage level ("H (High)" level) or low voltage level ("L (Low)" level) in accordance with the input data signals ird0x and the input data signal ird0z of the complementary system, respectively.

These input data signals ird0x and ird0z are inputted to the corresponding first and second data latch units, respectively, through N-channel transistors 130 and 132. The drains of these N-channel transistors 130 and 132 are connected to the input side of the first and second data latch units, respectively. The source of each N-channel transistor is connected to a power source Vss on the low voltage side (for example, the ground). One (ird0x) of the input data signals of the complementary system is latched by the first data latch unit on the basis of the timing of the start of the control signal pi0z supplied through the N-channel transistor 134. The signal latched in this way is outputted from the terminal from which one (d10z) of the output data signals is outputted. The other input data signal ird0z, too, is latched by the second data latch unit on the basis of the timing of the start of the control signal pi0z supplied through the N-channel transistor 136. The signal latched in this way is outputted from the terminal from which one (d10x) of the output data signals is outputted.

In the latch circuit shown in FIG. 5, further, the reset signal drst0x is supplied to the first data latch unit through the P-channel transistor 170 in order to assuredly reset the input data signal latched by the first data latch unit before the next input data signal is inputted. On the other hand, the reset signal drst0x is supplied to the second data latch unit through the P-channel transistor 180 to assuredly reset the input data signal latched by the second data latch unit before the next input data signal is inputted. The drains of these P-channel transistors 170 and 180 are connected to the input side of the first and second data latch units, respectively, and the sources of the P-channel transistors are connected to the power source Vii on the high voltage side (for example, the internal power source).

FIG. 6 shows the operation of the semiconductor integrated circuit shown in FIG. 4. The rise timing ("L"→"H") and the fall timing ("H"→"L") of each of the control signals pi0z, pi1z and piz must fall within the effective period of the desired data (for example, the first data D0) so that the data latch operation can be executed in the inputting order of the data DATA (the first to fourth data D0, D1, D2 and D3) inputted to the first to third latch circuits 190-1 to 190-3. Furthermore, when each of the reset signals drst0x, drst1x and drst2x (for example, the reset signal drst0x of the negative pulse) is inputted to the latch circuit, the data cannot be inputted to this latch circuit during the period in which this reset signal is supplied.

When the state of the first data D0 is not yet determined, for example, the phenomenon in which the outputs of the first and second data latch units exist at the same level (for example, both at the "L" level) will occur if the control signal pi0z rises to the "H" level, and the data that is once latched might be destroyed. The data that is once latched might be destroyed similarly if the control signals pi1z and pi2z rise to the "H" level in the case in which the second and third data D1 and D2 are not yet determined. Moreover, since there is a variance concerning the time necessary before the state of the inputted data is completely determined, it has been necessary to secure a certain margin from the time, at which the state of the data (for example, the first data D0 is determined to the time at which the control signal (for example, the control signal pi0z for controlling the first latch circuit) rises and the data latch operation is started.

When the pre-charge operation on the data bus is executed by using the reset circuit of the semiconductor integrated circuits having the pre-charge function according to the prior art, the problem occurs in that the semiconductor integrated circuit cannot be operated easily in synchronism with the high-speed clock, as explained with reference to FIGS. 1 to 3.

On the other hand, when the data latch operation is executed by a plurality of latch circuits in the conventional semiconductor integrated circuits having the data latch function, it has been necessary to secure the margin from the time at which the state of the data becomes definite to the time of the start of the data latch operation, as explained with reference to FIGS. 4 to 6. Therefore, the time delay before the data is latched by the latch circuit becomes large, and the data access time increases.

SUMMARY OF THE INVENTION

In view of the problems described above, it is the first object of the present invention to provide a semiconductor integrated circuit which makes it possible to execute high-speed operation by shortening a data occupied time on a data bus when the data is sampled by a strobe signal on the single-phase data bus for executing a pre-charge operation.

To solve the problems described above, it is the second object of the present invention to provide a semiconductor integrated circuit capable of shortening a data access time much more than in the prior art circuits when a data latch operation is executed by a plurality of latch circuits when the data is read out.

To accomplish the first object, a semiconductor integrated circuit according to the present invention starts the pre-charge operation upon receiving the end timing of a strobe signal in a reset circuit for executing the pre-charge operation of a data bus when the data transferred to the data bus is sampled by the strobe signal representing the effective period of this data.

Preferably, a plurality of driver circuits are connected to the data bus.

Preferably, further, the reset circuit detects the arrival of the data bus at the pre-charge level for executing the pre-charge operation and terminates the pre-charge operation.

Preferably, further, the reset circuit detects the arrival of the data bus at the pre-charge level for executing the pre-charge operation and then terminates the pre-charge operation after waiting for a predetermined time.

Preferably, further, the semiconductor integrated circuit according to the present invention can adjust a predetermined time from the detection of the arrival at the pre-charge level for executing the pre-charge operation to the termination of the pre-charge operation.

When the data of the data bus is sampled by the pulse of the strobe signal representing the effective period of the data in the semiconductor integrated circuit according to the present invention, the pre-charge operation of the data bus is started after receiving the end timing of the pulse of the strobe signal (the fall edge in the case of the positive pulse and the rise edge in the case of the negative pulse). Therefore, it is not necessary to secure a margin between the end of the strobe signal and the start of the reset signal.

Consequently, the semiconductor integrated circuit having the pre-charge function according to the present invention can reduce the data occupied time on the data bus much more than in the semiconductor integrated circuits according to the prior art, and can accomplish high-speed operation. In this way, the first object described above can be achieved.

On the other hand, the semiconductor integrated circuit for accomplishing the second object of the present invention for executing the data input/output operations in synchronism with a clock includes a plurality of latch circuit units for temporarily storing the data, that are disposed in a data read path, and each of these latch circuit units passes, as such, the data inputted thereto when a control signal corresponding to the data is inputted, and latches the data when the control signal is not inputted. Preferably, the semiconductor integrated circuit according to the present invention can reset the data latched by each of the latch circuit units.

Preferably, further, in a semiconductor integrated circuit for executing the data input/output operations in synchronism with a clock, including a plurality of latch circuit units for temporarily storing the data that are disposed in a data read path, each of the latch circuit units is equipped with data latching means including at least one flip-flop for storing serially for each bit the state of the data; and switching means for switching the passage or the latch of the data depending on whether or not the control signal corresponding to the data is inputted.

When the control signal is inputted to the switching means in the circuit construction described above, the data inputted to the data latching means is allowed to pass as such and when the control signal is not inputted to the switching means, the data is stored in the flip-flop.

Preferably, the switching means includes at least one AND gate for receiving the control signal and the data as its input signals.

Preferably, further, the semiconductor integrated circuit according to the present invention can reset the state of the data stored in the flip-flop.

Consequently, in the semiconductor integrated circuit having the data latch function according to the present invention, it is not necessary to secure the margin from the time at which the state of the data becomes definite to the time at which the data latch operation is started, and the data access time can be drastically reduced when the data latch operation is executed by a plurality of latch circuit units. In this way, the second object described above can be achieved.

BRIEF DESCRIPTION OF THE DRAWINGS

The above objects and features of the present invention will be more apparent from the following description of the preferred embodiments with reference to the accompanying drawings, wherein:

FIG. 13 is a timing chart useful for explaining the operation of the second embodiment of the present invention.

DESCRIPTION OF THE PREFERRED EMBODIMENTS

Hereinafter, the basic embodiment and preferred embodiments of the present invention will be explained with reference to the accompanying drawings (FIGS. 7 to 13).

Figure 7:
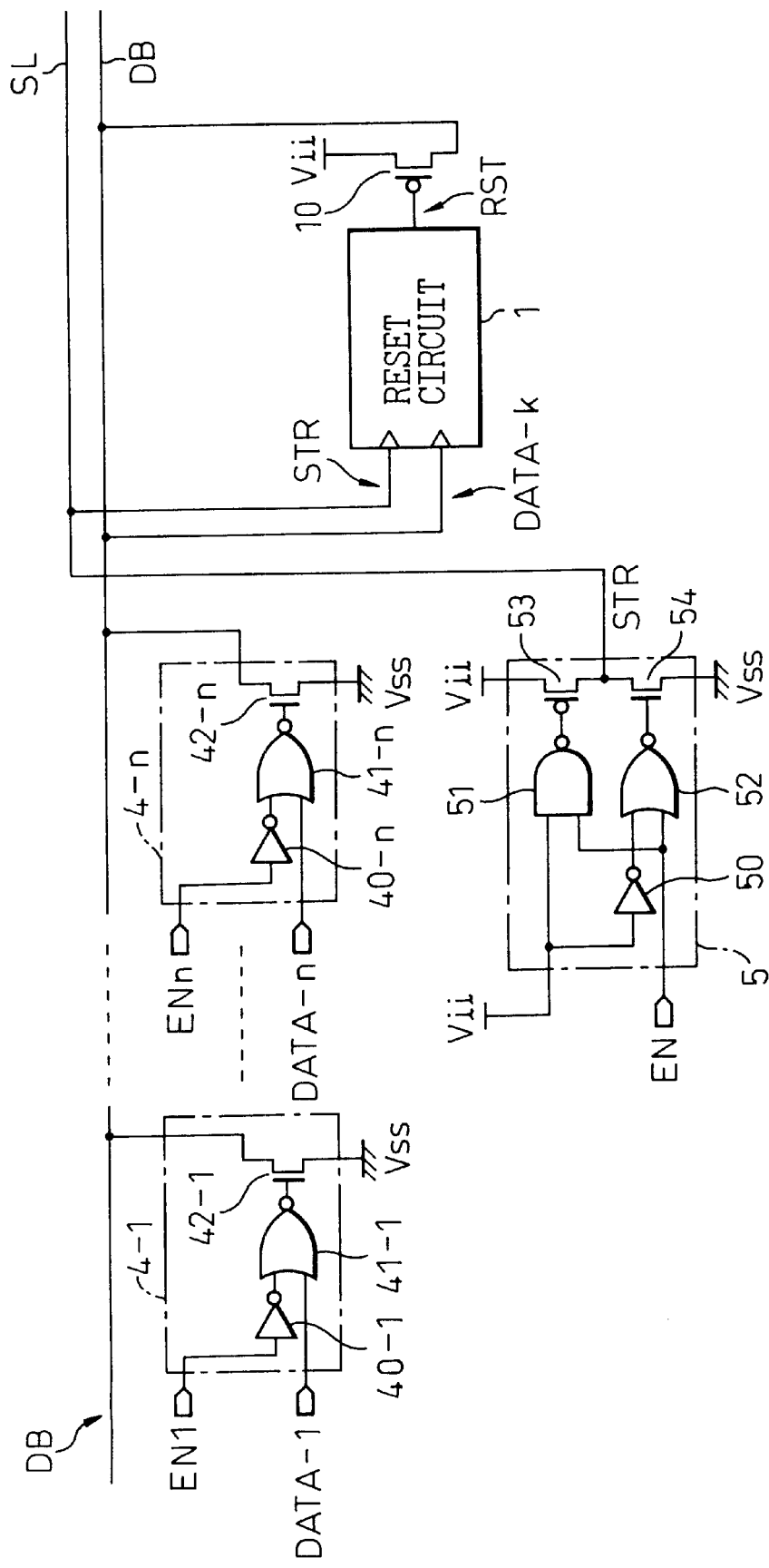
FIG. 7 is a circuit diagram showing the construction of the first embodiment of the present invention.
Figure 8:
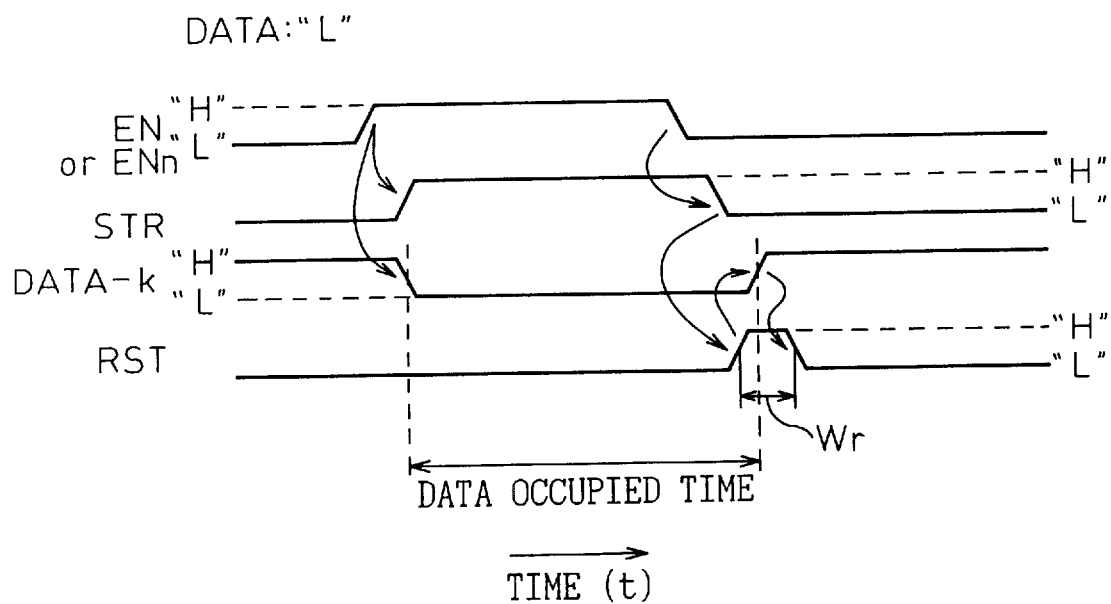
FIG. 8 is a timing chart useful for explaining the operation of the embodiment shown in FIG. 7.

FIG. 7 is a block circuit diagram showing the construction of the first embodiment of the present invention, and FIG. 8 is a timing chart useful for explaining the operation of the embodiment shown in FIG. 7. FIG. 7 shows a concrete circuit construction of a semiconductor integrated circuit for accomplishing the first object of the present invention. Like reference numerals will be used hereinafter to identify constituent elements that have been explained already.

In the semiconductor integrated circuit according to the first embodiment shown in FIG. 7, a plurality of driver circuits (that is, a first driver circuit to an nth driver circuit 4-n (where n is an arbitrary positive number equal to 1 or more than 1) are connected to a single-phase data bus DB. These driver circuits include first to nth inverters 40-1 to 40-n, first to nth NOR gates 41-1 to 41-n and first to nth N-channel transistors 42-1 to 42-n, respectively. Enable signals EN1 to ENn are inputted to one of the input terminals of the first to nth NOR gates 41-1 to 41-n through the first to nth inverters 40-1 to 40-n. When the semiconductor integrated circuit is in the read mode, the enable signals EN1 to ENn represent that the data are read out from the memory cells. Here, the enable signals EN1 to ENn are inputted to a plurality of driver circuits, respectively, and one of them operates. On the other hand, the data DATA-1 to DATA-n are inputted to the other input terminals of the first to nth NOR gates 42-1 to 42-n, respectively. Furthermore, the signals outputted from the first to nth NOR gates 41-1 to 41-n are transferred to the data bus DB through the first to nth N-channel transistors 42-1 to 42-n.

One strobe signal line SL is provided to the data bus DB described above, and the strobe signal STR representing the data effective period is sent on this strobe signal line SL. There is further provided a strobe signal generating circuit 5 for generating the strobe signal STR. The strobe signal generating circuit 5 includes an inverter 50, a NAND gate 51, a NOR gate 52, a P-channel transistor 53 and an N-channel transistor 54. Here, the source of the P-channel transistor 53 is connected to a power source (internal power source) Vii having a positive polarity and its drain is connected to the drain of the N-channel transistor 54. On the other hand, the source of the N-channel transistor 54 is connected to a power source (ground) vss having a negative polarity.

In FIG. 7, there is further disposed a reset circuit 1 that operates on the basis of the end timing of the strobe signal STR and the end timing of an arbitrary data (for example, data DATA-k ($1 \leq k \leq n$)). The output terminal of this reset circuit 1 is connected to the data bus line DB through the P-channel transistor 10.

Figure 1:
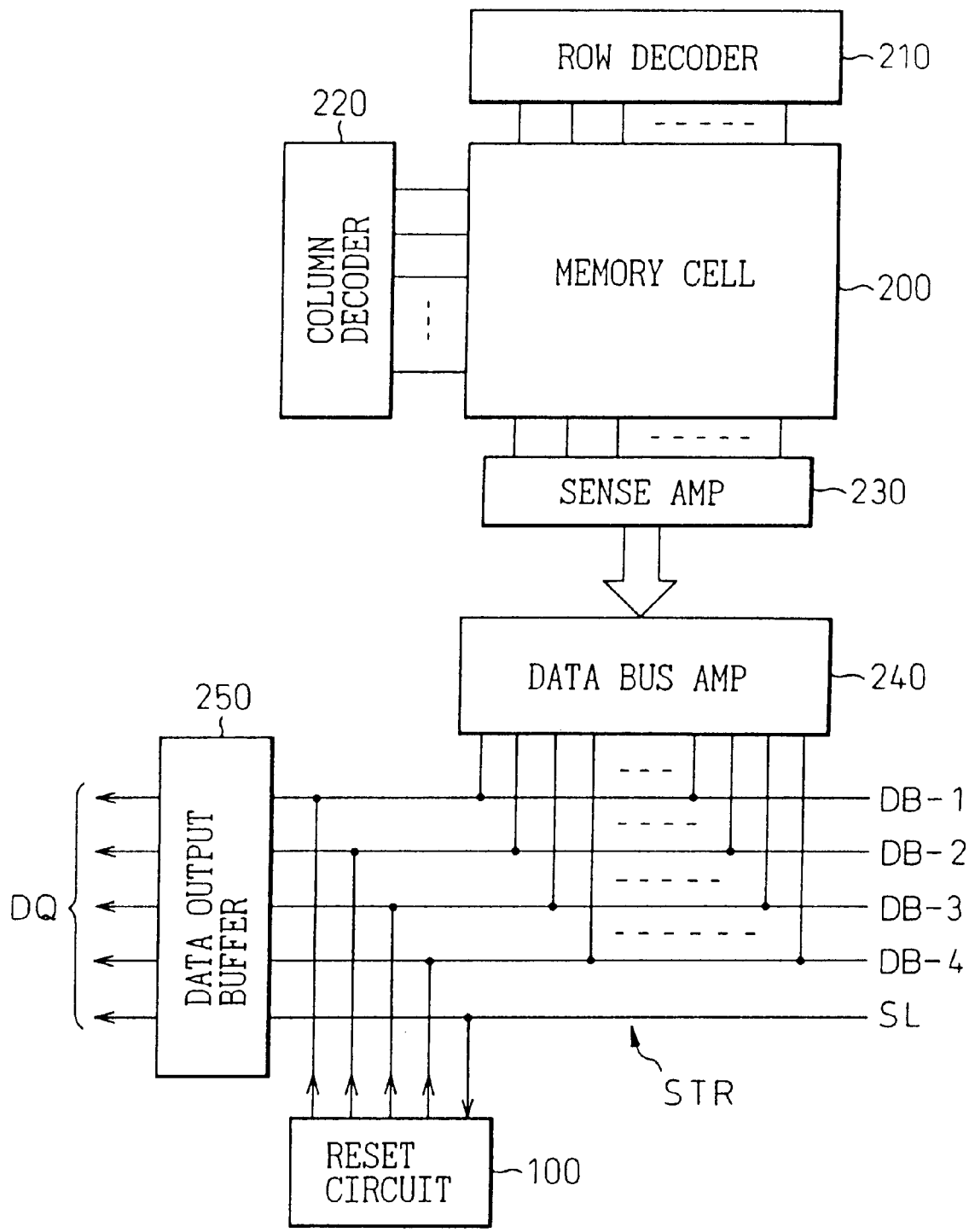
FIG. 1 is a block diagram showing a schematic construction of a semiconductor integrated circuit equipped with a pre-charge function according to the prior art.
Figure 2:
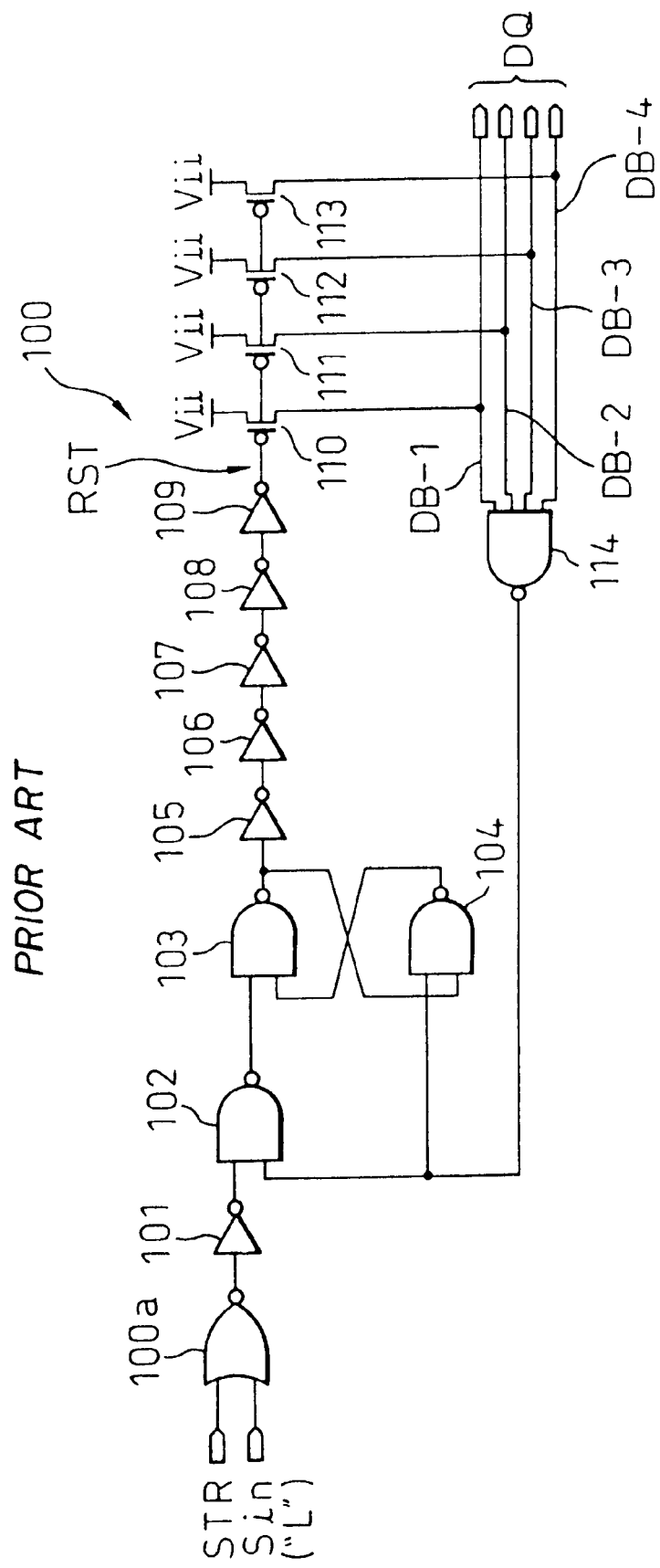
FIG. 2 is a circuit diagram showing a concrete construction of the reset circuit shown in FIG. 1.
Figure 3:
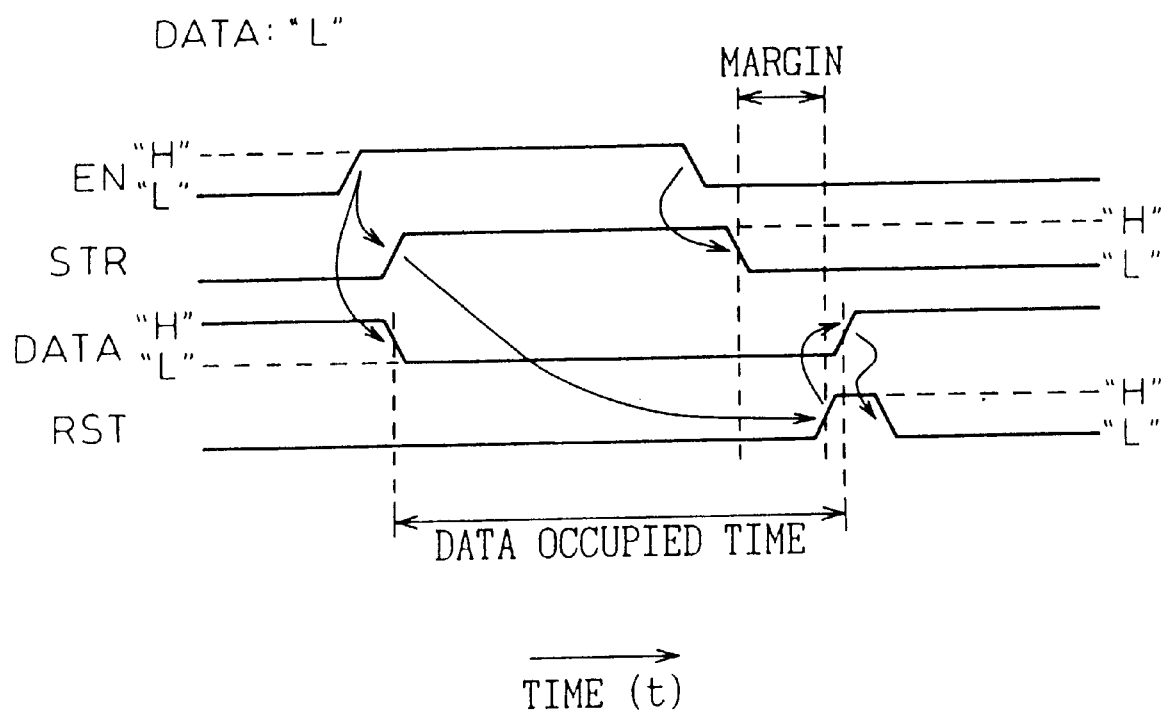
FIG. 3 is a timing chart useful for explaining the operation of the circuit shown in FIG. 2.

As described above, in the reset circuit of the semiconductor integrated circuit according to the prior art, the strobe signal STR is outputted when the circuit receives the enable signal EN, and the reset signal RST is outputted from the rise edge of this strobe signal STR (see the timing chart of FIG. 3). In this prior art system, it has been necessary to secure the margin between the end of the strobe signal and the start of the reset signal in order to avoid the "Bus-Fight" on the data bus DB that occurs between one of a plurality of N-channel transistors (42-1 to 42-n) and the P-channel transistor (10) when both of these transistors are turned ON.

In contrast, in the system of the first embodiment shown in FIG. 7, the reset signal RST for the pre-charge operation of the data bus is outputted after the fall timing of the strobe signal STR is received as shown in the timing chart of FIG. 8. Therefore, the margin described above need not be secured. In other words, the first embodiment shown in FIG. 7 can shorten the data occupied time on the data bus and can improve the operating frequency of the semiconductor integrated circuit.

Figure 9:
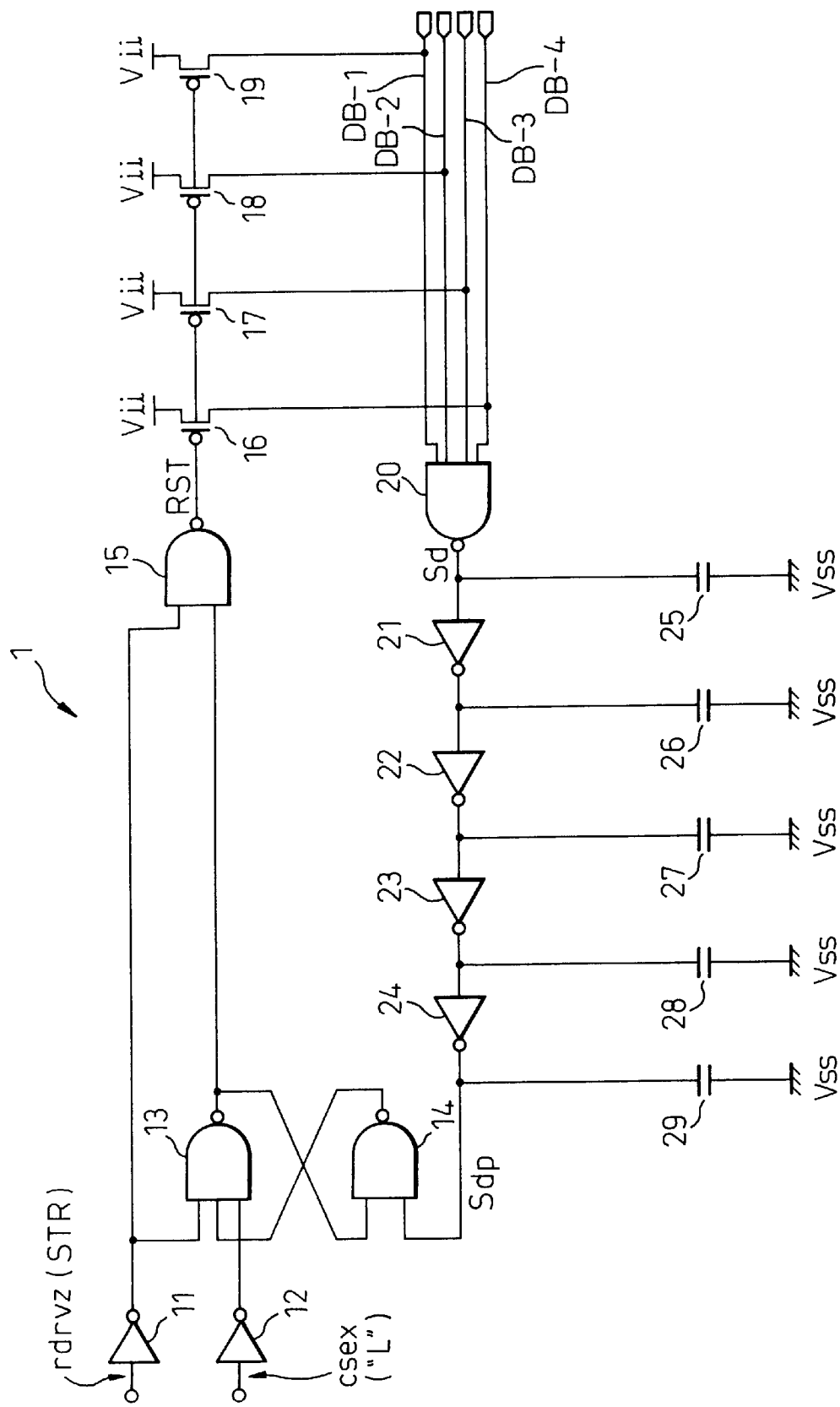
FIG. 9 is a circuit diagram showing a concrete construction of a reset circuit in the first embodiment according to the present invention.

FIG. 9 is a circuit diagram showing a concrete construction of the reset circuit according to the first embodiment of the present invention. The reset circuit 1 shown in FIG. 9 has the function of resetting simultaneously the data transferred on four data buses DB-1, DB-2, DB-3 and DB-4. A latch circuit comprising two NAND gates 13 and 14 is provided in the reset circuit 1 shown in FIG. 9. This latch circuit has the function of latching the data transferred on the four data buses DB-1 to DB-4 by the strobe signal STR (signal rdrvz) inputted through an inverter 11. Furthermore, a specific signal csex is inputted to the latch circuit through another inverter 12. Since this signal csex is normally set to the "L" level, a signal of the "H" level is always inputted to the latch circuit, and the signal csex does not affect the data latch operation.

In the reset circuit shown in FIG. 9, a NAND gate 15 is disposed on the output side of the latch circuit. This NAND gate 15 generates a signal, which is generated by inverting the strobe signal STR, and the reset signal RST for executing the pre-charge operation of the four data buses on the basis of the output signal of the latch circuit. This reset signal RST is inputted to the gates of a plurality of P-channel transistors 16 to 19. The P-channel transistors 16 to 19 are connected to the power source Vii of the positive polarity, and the drains of these transistors are connected to the data buses DB-1 to DB-4, respectively. The reset signal RST is delivered from the drains of the P-channel transistors 16 to 19 to the corresponding data buses DB-1 to DB-4, respectively.

In the reset circuit shown in FIG. 9, there is further provided a delay unit for setting a pulse width Wr of the reset signal RST. This delay unit comprises the combination of a plurality of inverters 21 to 24 (for example, four inverters) with a plurality of capacitors 25 to 29 for setting the reset pulse width (for example, four reset pulse width setting capacitors). The delay unit generates a delay signal Sdp by imparting a predetermined delay time to the signal Sd sent from the four data buses DB-1 to DB-4 by a plurality of reset pulse width setting capacitors 25 to 29 and supplies this delay signal to the latch circuit. The NAND gate 15, to which the output signal of this latch circuit is inputted, outputs the reset signal RST having a pulse width Wr corresponding to the delay time described above. In other words, the NAND gate 15 has the function of detecting that the data bus reaches the pre-charge level for executing the pre-charge operation, and terminating the pre-charge operation. Strictly speaking, the pre-charge operation is terminated after waiting for the time corresponding to the pulse width Wr of the reset signal RST (that is to say, after the latency time corresponding the pulse width Wr passes).

Data buses in general are likely to have long distance wiring with a relatively large time constant in many cases. In these cases, the data buses far away from the reset circuit are not sufficiently reset in some cases even when the data buses in the proximity of the reset circuit of the present invention shown in FIG. 9 are sufficiently reset. In this case, the data buses far from the reset circuit can be reset effectively, too, by setting the pulse width of the reset signal RST to a large value.

Figure 10:
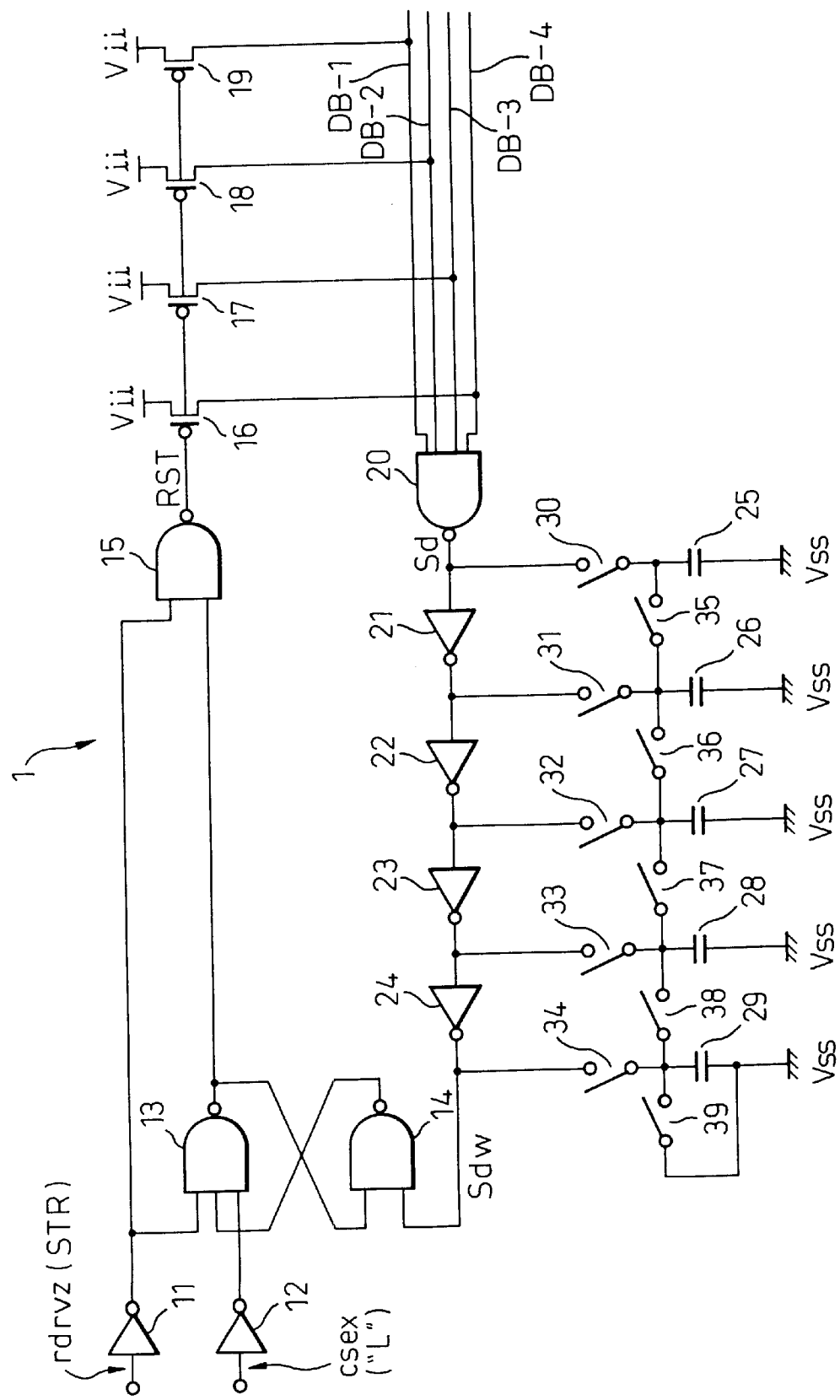
FIG. 10 is a circuit diagram showing a modified example of the reset circuit shown in FIG. 9.

FIG. 10 is a circuit diagram showing a modified example of FIG. 9. In the reset circuit shown in FIG. 10, a plurality of switch devices 30 to 39 for adjusting the reset pulse width (for example, nine reset pulse width adjusting switch devices) are added to the delay unit of the reset circuit shown in FIG. 9. The constructions of FIG. 10 other than the delay unit are the same as the construction of the reset circuit shown in FIG. 9. Therefore, the detailed explanation will be hereby omitted.

The delay unit in the reset circuit shown in FIG. 10 changes the relationship concerning a connection among a plurality of inverters 21 to 24 and a plurality of reset pulse width setting capacitors 25 to 29 by setting each of the reset pulse width adjusting switch devices 30 to 39 to ON or OFF. In this way, the pulse width of the reset signal RST can be easily adjusted to a suitable value. In other words, the latency time corresponding to the pulse width Wr of the reset signal RST can be adjusted in the reset circuit shown in FIG. 10.

As described above, the semiconductor integrated circuit according to the first embodiment of the present invention starts, first, the pre-charge operation of the data bus after it receives the end timing of the pulse of the strobe signal, when it samples the data on the data bus by the pulse of the strobe signal. Therefore, the margin need not be secured between the end of the strobe signal and the start of the reset signal, and the data occupied time on the data bus can be reduced much more than in the prior art devices. In consequence, the first embodiment can accomplish high-speed operation of the semiconductor integrated circuit.

In the semiconductor integrated circuit according to the first embodiment, second, the pre-charge operation is terminated after the arrival of the data bus at the pre-charge level is detected. Therefore, possible "Bus-Fight" on the data bus can be eliminated and data sampling can be executed at high speed and accurately.

In the semiconductor integrated circuit according to the first embodiment, third, the pre-charge operation is terminated after the passage of a predetermined time after the detection of the arrival of the data bus at the pre-charge level. Therefore, the pre-charge operation can be executed sufficiently for the data buses far from the reset circuit, too.

In the semiconductor integrated circuit according to the first embodiment, fourth, the predetermined time described above can be adjusted. Therefore, the pulse width of the reset signal can be set to a suitable value in accordance with the length of the bus lines, and so forth.

Figure 11:
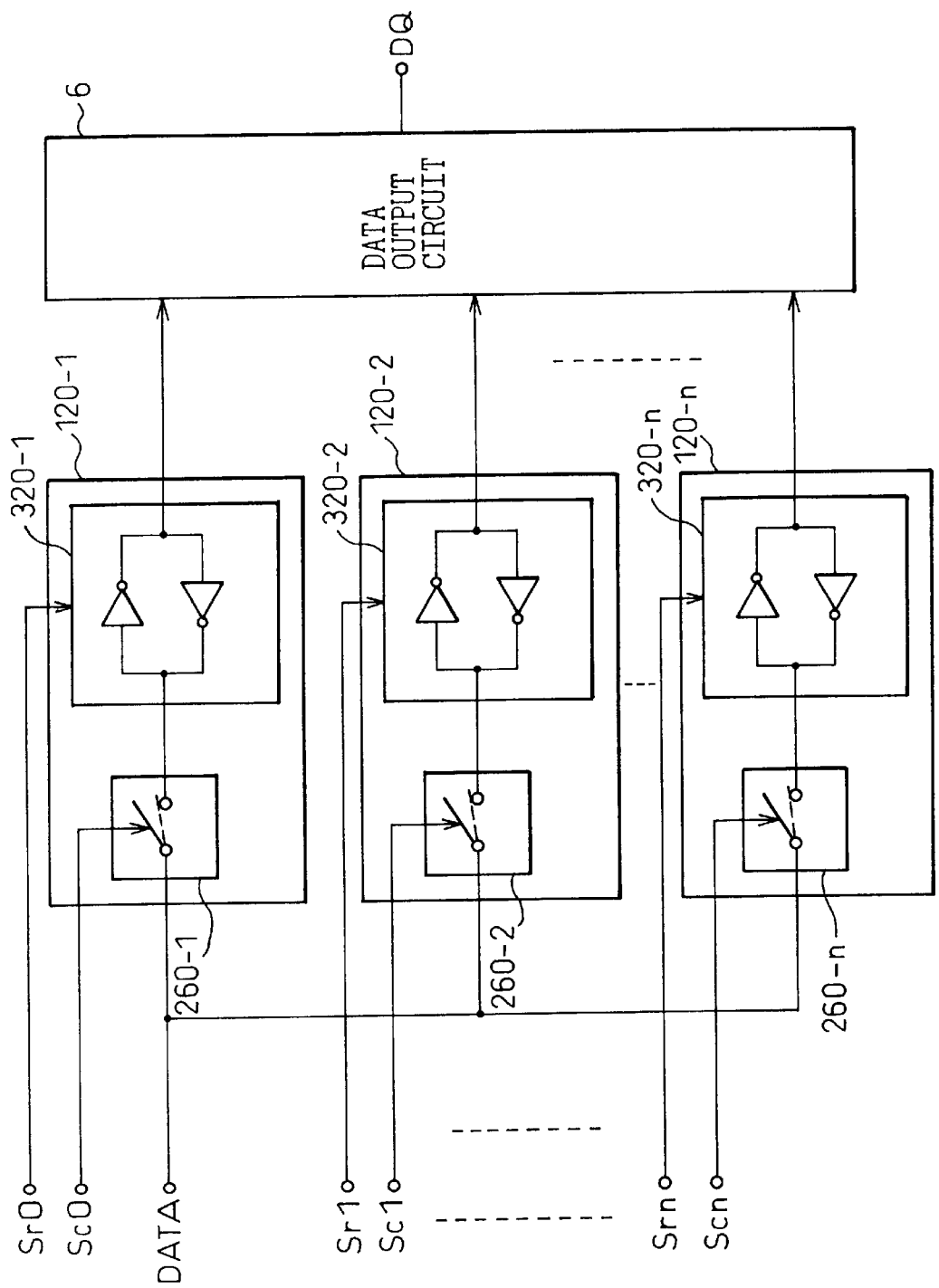
FIG. 11 is a block diagram showing a principal construction of the basic embodiment which is deemed as the premise of the second embodiment of the present invention.

FIG. 11 is a block diagram showing the construction of the basic embodiment based on the principle which is deemed as the premise of the second embodiment of the present invention. This drawing clearly illustrates the feature of the semiconductor integrated circuit for achieving the second object of the present invention.

As shown in FIG. 11, a plurality of latch circuit units (first latch circuit unit 120-1 to nth latch circuit unit 120-n) for temporarily storing the data are disposed in the data read route of the semiconductor integrated circuit of the basic embodiment of the present invention for executing the data input/output operations in synchronism with the clock. Each of these first to nth latch circuit 120-1 to 120-n includes data latching means (first data latching means 320-1 to nth data latching means 320-n) having at least one flip-flop for serially storing the state of the data for each bit; and switching means (first switching means 260-1 to nth switching means 260-n) for switching the passage and the latch of the data depending on whether or not the control signal Sc0 to Scn corresponding to the data is inputted.

Referring to FIG. 11, when the control signal (which may be either the positive pulse or the negative pulse) is inputted to the switching means, the data that is inputted to the data latching means is allowed to pass as such, and when the control signal is not inputted to the switching means, the state of the data that finally passes through the data latching means is stored by the flip-flop. The data that passes through the data latching means is outputted outside the semiconductor integrated circuit through the data output circuit 6 (output data DQ).

Preferably, in the semiconductor integrated circuit according to the basic embodiment of the present invention, the switching means described above includes at least one AND gate that receives the control signal and the data as the input signals thereof.

Preferably, further, the switching means in the semiconductor integrated circuit of the present invention can reset the state of the data stored in the flip-flop by using the reset signals Sr0 to Srn.

In the semiconductor integrated circuit according to the basic embodiment of the present invention, the data inputted to each latch circuit unit is allowed to pass, as such, through the latch circuit unit at the timing at which the control signal is inputted to each of the latch circuits as described above, and the data that finally passes through the data latch circuit unit is latched at the timing at which the control signal terminates. Therefore, it is no longer necessary to strictly set the timing from the point at which the state of the data is determined to the timing at which the control signal is inputted. In other words, the timing of the start of the control signal with respect to the data can be rendered "timing-free".

In summary, the semiconductor integrated circuit according to the basic embodiment of the present invention need not secure the margin in the data read operation, from the timing at which the state of the data is determined, to the timing at which the data latch operation is started, and the data access time can be drastically reduced when the data latch operation is executed by a plurality of latch circuit units.

Next, the second embodiment of the present invention will be explained with reference to FIGS. 12 and 13 of the accompanying drawings. This second embodiment represents a concrete circuit construction for accomplishing the second object of the present invention.

Figure 12:
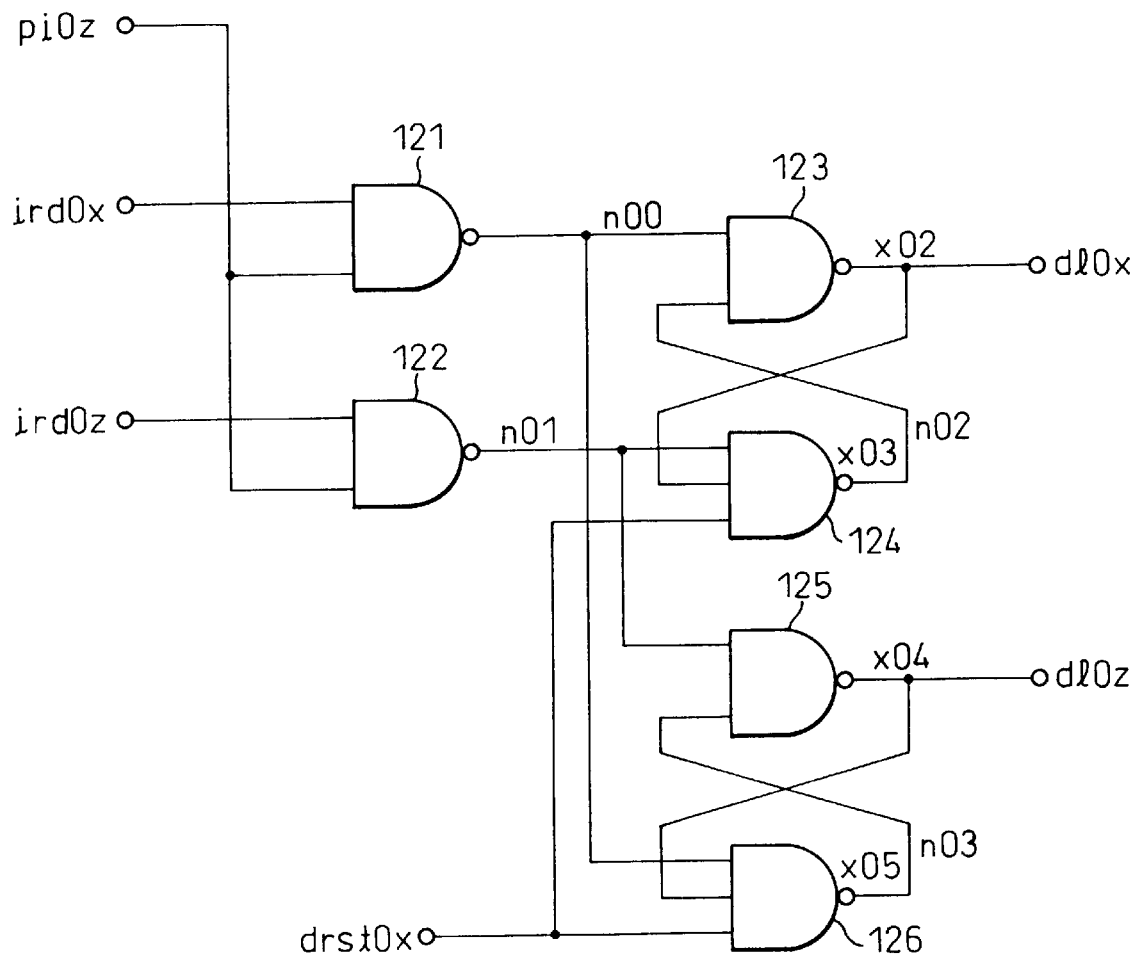
FIG. 12 is a circuit diagram showing a concrete construction of a latch circuit in the second embodiment of the present invention.

FIG. 12 is a circuit diagram showing a concrete construction of a latch circuit according to the second embodiment, and FIG. 13 is a timing chart useful for explaining the operation of the second embodiment of the present invention.

Figure 4:
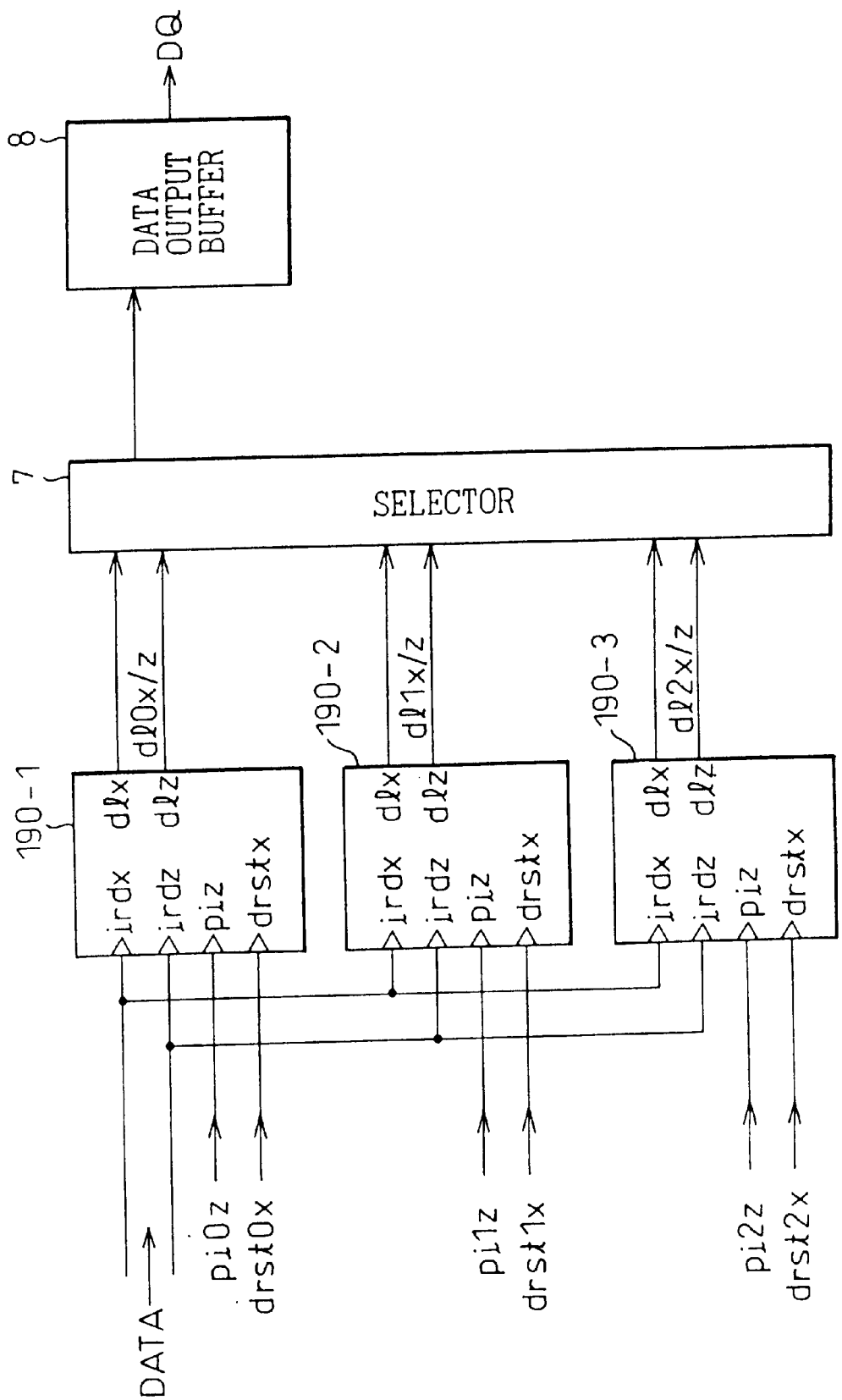
FIG. 4 is a block diagram showing the construction of a semiconductor integrated circuit equipped with a data latch function according to the prior art.
Figure 5:
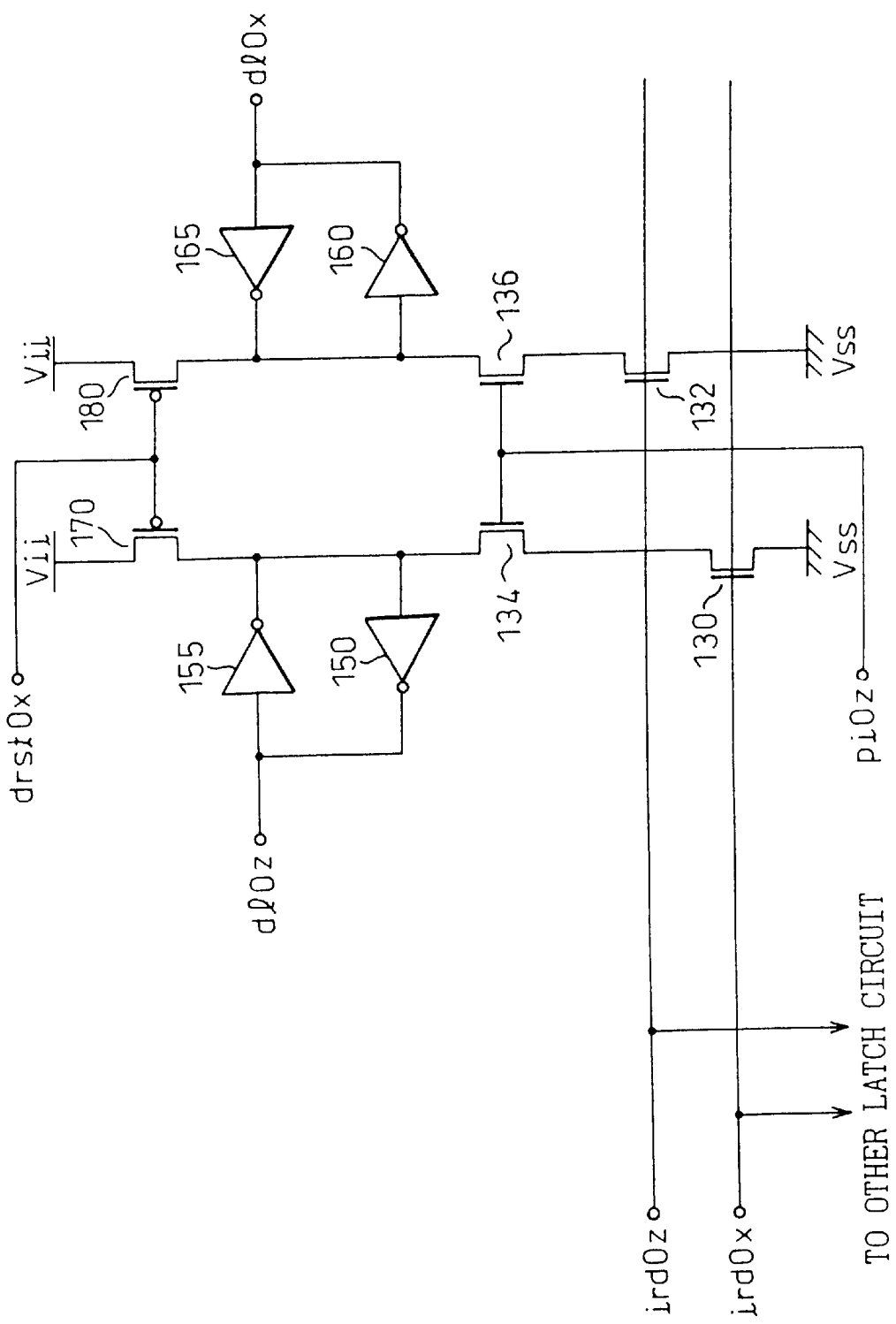
FIG. 5 is a circuit diagram showing the construction of a latch circuit in a semiconductor integrated circuit according to the prior art.
Figure 6:
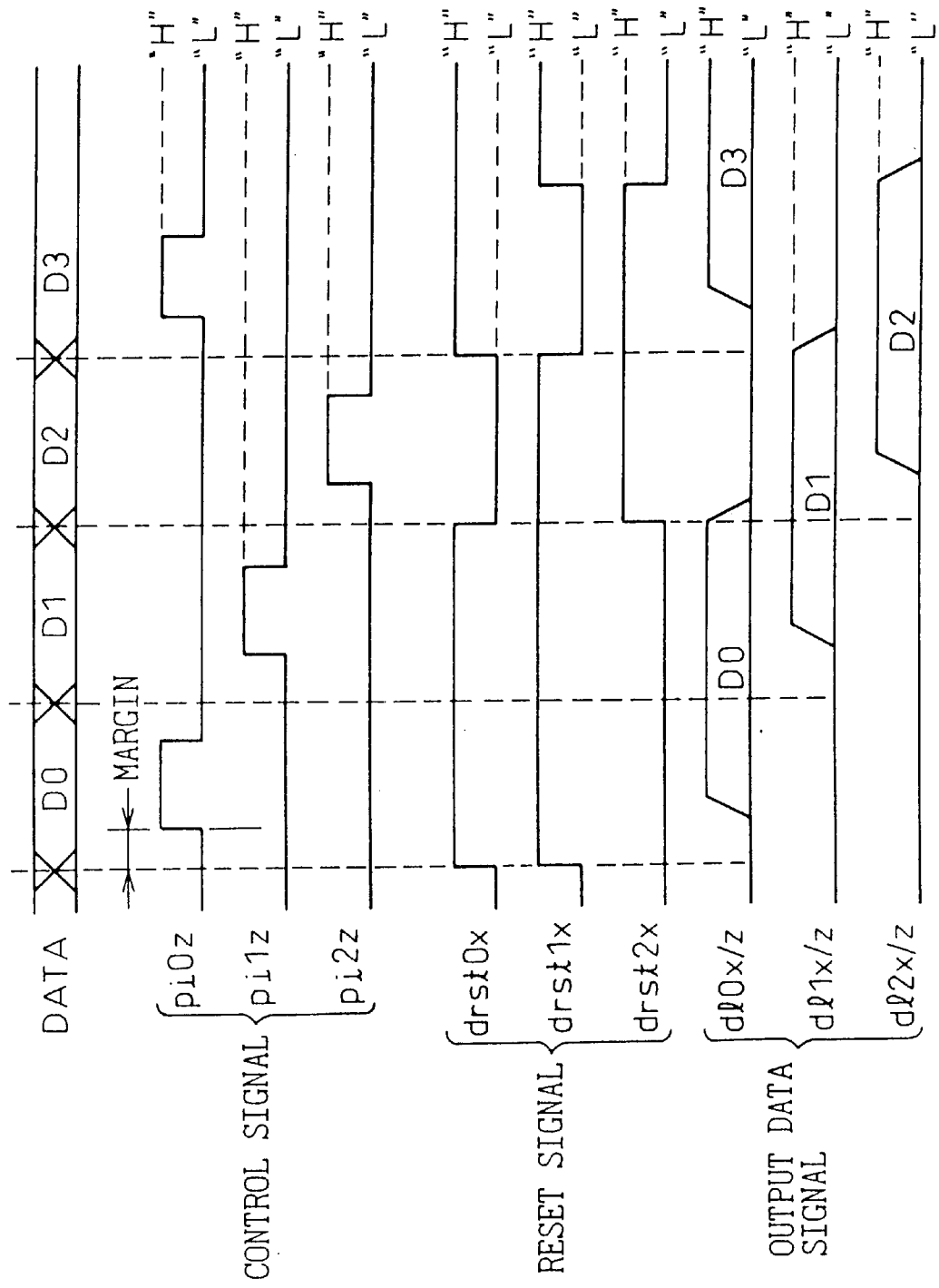
FIG. 6 is a timing chart useful for explaining the operation of the semiconductor integrated circuit shown in FIG. 4.

This embodiment, too, typically represents the construction of the semiconductor integrated circuit and its operation when wave pipeline control is executed by using an FIFO comprising three latch circuits that are disposed in parallel in the data read path, in the same way as in the prior art technology (see FIGS. 4 and 5). However, the schematic construction of this semiconductor integrated circuit is the same as the construction typically represented as the prior art technology shown in FIG. 5. Therefore, the construction and the operation of the embodiment of the present invention will be explained hereby with reference to FIGS. 5, 12 and 13.

In the semiconductor integrated circuit according to the second embodiment of the present invention, first to third latch circuits 120-1 to 120-3 are disposed in parallel with the data read path as a plurality of latch circuit units of the present invention (see FIG. 11). These first to third latch circuits 120-1 to 120-3 temporarily store the complementary data DATA read out from a plurality of memory cells (not shown, in particular) that are arranged in matrix. These three latch circuits 120-1 to 120-3 have the function of serially latching the data DATA for each bit in synchronism with the clock and have also the function of sending serially the data DATA in the latching sequence to the data output buffer 8. Therefore, they are generally referred to as a "FIFO".

The explanation will be given in further detail. The three latch circuits 120-1 to 120-3 serially latch the input data signals irdz and irdz representing the data DATA of the complementary system for each bit on the basis of the control signals pi0z, pi1z and pi2z for controlling the corresponding data latches. These control signals pi0z, pi1z and pi2z correspond to the control signals Sc0 to Scn, respectively. The input data signals that are previously latched in the latch circuits 120-1 to 120-3 are reset by the corresponding reset signals drst0x, drst1x and drst2x so that the input signals to be next inputted can be reliably latched. These reset signals drst0x, drst1x and drst2x correspond to the reset signals Sr0 to Srn shown in FIG. 11, respectively. In other words, the state of the data stored in the latch circuits 120-1 to 120-3 (that is, the "H" level or the "L" level) is released by the control signal pi0z, pi1z and pi2z. The data bus representing the read route of the data DATA is connected in common to the three latch circuits 120-1 to 120-3, and the input data signals irdx and irdz are inputted in common to the three latch circuits.

In FIG. 12, the data of the complementary system (d1x and d1z) that pass through the latch circuits 120-1 to 120-3 are sent as the output data signals d10x, d10z, d11x, d11z, d12x and d12z to the selector 7. The output data signals d10x, d10z, d11x, d11z, d12x and d12z are outputted outside the semiconductor integrated circuit through the data output buffer 8 (output data DQ). In this case, though the number of kinds of data is three, each data has the complementary system, and six output data signals, in all, are outputted.

FIG. 12 shows the concrete construction of each of the latch circuits 120-1 to 120-3 according to the second embodiment of the present invention. Each latch circuit shown in FIG. 12 (for example, the first latch circuit 120-1) includes, as the data latching means of the present invention (see FIG. 11), a first flip-flop comprising two NAND gates 123 and 124 and a second flip-flop comprising two NAND gates 125 and 126, for serially storing the state of the input data signals of the complementary system for each bit. Here, the first flip-flop is the one that stores the state of the "H" level or the "L" level of one of the input data signals ird0x, and the second flip-flop is the one that stores the state of the "H" level or the "L" level of the other input data signal ird0z.

The latch circuit shown in FIG. 12 includes, as the switching means of the present invention (see FIG. 11), a first NAND gate (AND gate) 121 for receiving the control signal for the data latch control (for example, the control signal pi0z) and one of the input data signals ird0x as two input signals thereof, and a second NAND gate (AND gate) 122 for receiving the control signal for the data latch control and the other input data signal ird0z as the two input signals thereof.

When the control signal pi0z is supplied (for example, when the control signal is at the "H" level), the first NAND gate inputs the signal, which is obtained by inverting the level of one of the input data signal ird0x, to the first flip-flop and inputs the "H" level signal to the first flip-flop irrespective of the state of the data signal when the control signal pi0z is not supplied (for example, when it is at the "L" level). In other words, the first NAND gate operates the first flip-flop so as to latch the input data signal only when the control signal pi0z is supplied. On the other hand, the second NAND gate inputs the signal, which is obtained by inverting the level of the other input data signal ird0z, to the second flip-flop when the control signal pi0z is at the "H" level, and inputs the "H" level signal to the second flip-flop irrespective of the state of the data signal when the control signal pi0z is at the "L" level. In other words, when the control signal pi0z of the positive pulse rises and remains at the "H" level, the latch circuit operates the flip-flops and allows the input signals to serially pass, and finally determines the state of the input data signals by latching the input data signals passing through the flip-flops at the timing of the fall of the control signals.

Therefore, since the latch circuit shown in FIG. 12 can make "timing-free" the timing of the rise of the control signal for the data, the latch circuit can finally latch the correct data at the timing of the fall of the control signal even when the control signal is supplied at a timing earlier than the timing of the data.

FIG. 13 shows the operation of the second embodiment shown in FIG. 12. The fall of each of the control signals pi0z, pi1z and piz ("H"→"L") must fall within the effective period of the desired data (for example, the first data D0 so that the data latch operation can be executed in the latching sequence of the data DATA (first to fourth data D0, D1, D2 and D3) inputted to the first to third latch circuits 120-1 to 120-3. As described already, however, the rise timing of each of the control signals pi0z, pi1z and pi2z ("L"→"H")need not be set strictly, the control signal (for example, the first control signal pi0z) can be supplied at the timing earlier than the start of the data (for example, the first data D0, no matter whether the state of the data may be determined or not.

Therefore, because the second embodiment need not secure the margin from the timing at which the data (for example, the first data D0 is determined, to the timing at which the control signal (for example, the first control signal pi0z) rises and the data latch operation is started, the second embodiment can eliminate almost completely the time delay until the data is latched by the latch circuit, and can drastically reduce the data access time. In this case, after the state of the data (for example, the first data D0 that passes finally is determined, it becomes possible to release the state of the data (the "H" level or the "L" level) stored in the flip-flop in the latch circuit by supplying the reset signal (for example, the first reset signal drst0x) to the latch circuit, and to input the fourth data D3.

As described above, the semiconductor integrated circuit according to the second embodiment of the present invention, first, allows the data inputted to a plurality of latch circuit units to pass as such through the latch circuit units when the control signal for controlling the data latch is inputted, and latches the data by the latch circuit units when the control signal is not inputted. Therefore, it is not necessary to secure the margin between the timing at which the data is determined and the timing at which the control signal is started, and to drastically shorten the data access time.

Second, the semiconductor integrated circuit according to the second embodiment can quickly reset the data latched by the latch circuit units after the data transfer. Consequently, the second embodiment can assuredly output the data in the data inputting sequence without increasing the data access time.

Third, the semiconductor integrated circuit according to the second embodiment operates the flip-flops of a plurality of latch circuit units so as to permit the data to pass through them when the control signal for controlling the data latch is inputted, and stores the data when the control signal is not inputted. Therefore, the second embodiment need not secure the margin between the timing at which the data is determined and the timing of the start of the control signal, and can drastically shorten the data access time.

Fourth, the semiconductor integrated circuit according to the second embodiment detects, by using the NAND gates, whether or not the control signal is inputted, and switches the data passage and the data latching by the flip-flops of a plurality of latch circuit units in accordance with the detection result. Therefore, the second embodiment can finally latch the correct data in the flip-flops of the latch circuit units by a simple circuit construction.

Fifth, the semiconductor integrated circuit according to the second embodiment can quickly reset the data in the flip-flops after the transfer of the data in the flip-flops of the latch circuit units. Therefore, the second embodiment can correctly output the data in the inputting sequence of the data to the flip-flops without increasing the data access time.

What is claimed is:

1. A semiconductor integrated circuit including a reset circuit for executing a pre-charge operation of a data bus when data transferred to said data bus is sampled by a strobe signal representing an effective period of said data, wherein said reset circuit starts said pre-charge operation after receiving an end timing of said strobe signal.

2. A semiconductor integrated circuit according to claim 1, wherein a plurality of driver circuits are connected to said data bus.

3. A semiconductor integrated circuit according to claim 1, wherein said reset circuit detects that said data bus reaches a pre-charge level for executing said pre-charge operation, and then terminates said pre-charge operation.

4. A semiconductor integrated circuit according to claim 1, wherein said reset circuit detects that said data bus reaches said pre-charge level for executing said pre-charge operation, and then terminates said pre-charge operation after the passage of a predetermined period.

5. A semiconductor integrated circuit according to claim 4, which can adjust said predetermined time.

6. A semiconductor integrated circuit for executing input/output operations of data in synchronism with a clock, including a plurality of latch circuit units for temporarily storing said data, disposed on a read path of said data, wherein each of said latch circuit units allows an inputted data to pass, as such, through said latch circuit unit when a control signal corresponding to said data is inputted, and latches said inputted data when said control signal is not inputted and which can reset said data latched by each of said latch circuit units.

7. A semiconductor integrated circuit for executing input/output operations of data in synchronism with a clock, including a plurality of latch circuit units for temporarily storing said data, disposed in a read path of said data, wherein each of said latch circuit units includes:

data latching means for serially storing the state of said data for each bit, containing at least one RS-flip-flop; and switching means for switching the passage or latching of said data depending on whether or not a control signal corresponding to said data is inputted;

wherein said data inputted to said data latching means are allowed to pass, as such, when said control signal is inputted to said switching means, and are stored in said at least one RS-flip-flop when said control signal is not inputted to said switching means.

8. A semiconductor integrated circuit according to claim 7, wherein said switching means includes at least one logical AND gate for receiving said control signal and said data as input signals thereof.

9. A semiconductor integrated circuit according to claim 7, which can reset the state of said data stored in said flip-flops.

10. A semiconductor integrated circuit for executing input/output operations of data in synchronism with a clock, including a plurality of latch circuit units for temporarily storing said data, disposed in a read path of said data, wherein each of said latch circuit units includes:

data latching means for serially storing the state of said data for each bit, containing at least one flip-flop; and switching means for switching the passage or latching of said data depending on whether or not a control signal corresponding to said data is inputted;

wherein said data inputted to said data latching means are allowed to pass, as such, when said control signal is inputted to said switching means, and are stored in said at least one flip-flop when said control signal is not inputted to said switching means and wherein said semiconductor integrated circuit can reset the state of said data stored in said at least one flip-flop.

11. A semiconductor integrated circuit according to claim 10, wherein said switching means includes at least one logical AND gate for receiving said control signal and said data as input signals thereof.

* * * * *